(12) United States Patent
Fossum et al.

(10) Patent No.: US 7,388,239 B2
(45) Date of Patent: Jun. 17, 2008

(54) FRAME SHUTTER PIXEL WITH AN ISOLATED STORAGE NODE

(75) Inventors: Eric R. Fossum, La Crescenta, CA (US); Sandor L. Barna, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 10/623,533

(22) Filed: Jul. 22, 2003

(65) Prior Publication Data

US 2005/0077549 A1  Apr. 14, 2005

Related U.S. Application Data

(62) Division of application No. 09/792,634, filed on Feb. 23, 2001, now Pat. No. 6,624,456.

(51) Int. Cl.
*H01L 27/146* (2006.01)

(52) U.S. Cl. ............... 257/225; 257/291; 257/292; 257/294; 257/E27.128; 257/E27.132; 257/E27.156; 257/E27.162

(58) Field of Classification Search ........ 257/291–292, 257/225, 223, 294; 438/54, 70, 48
See application file for complete search history.

(56) References Cited

U.S. PATENT DOCUMENTS

| | | | |
|---|---|---|---|
| 4,087,833 A | 5/1978 | Tseng | |
| 5,541,402 A | 7/1996 | Ackland et al. | |
| 5,587,596 A | 12/1996 | Chi et al. | |
| 5,869,857 A | 2/1999 | Chen | |
| 5,900,623 A | 5/1999 | Tsang et al. | |
| 5,986,297 A * | 11/1999 | Guidash et al. | 257/223 |
| 6,025,210 A | 2/2000 | Matsuda et al. | |
| 6,051,857 A * | 4/2000 | Miida | 257/292 |
| 6,069,376 A | 5/2000 | Merrill | |
| 6,087,686 A | 7/2000 | Fox et al. | |
| 6,160,281 A | 12/2000 | Guidash | |
| 6,160,282 A | 12/2000 | Merrill | |
| 6,215,113 B1 | 4/2001 | Chen et al. | |
| 6,218,692 B1 | 4/2001 | Guidash et al. | |
| 6,326,230 B1 | 12/2001 | Pain et al. | |
| 6,369,853 B1 | 4/2002 | Merrill et al. | |
| 6,380,572 B1 | 4/2002 | Pain et al. | |
| 6,498,622 B1 * | 12/2002 | Nakashiba | 348/308 |
| 6,618,086 B1 * | 9/2003 | Kawahara et al. | 348/302 |
| 6,778,213 B1 * | 8/2004 | Nakashiba | 348/308 |
| 6,859,227 B1 * | 2/2005 | Andersson et al. | 348/241 |
| 2002/0011551 A1 | 1/2002 | Nair | |
| 2002/0022295 A1 * | 2/2002 | Pan | 438/57 |

FOREIGN PATENT DOCUMENTS

| | | | |
|---|---|---|---|
| JP | 9-266297 | * | 10/1997 |
| JP | 9-275201 | | 10/1997 |
| JP | 11-274463 | * | 10/1999 |
| WO | WO 97/28558 | * | 8/1997 |

* cited by examiner

*Primary Examiner*—A. Sefer
(74) *Attorney, Agent, or Firm*—Dickstein Shapiro. LLP

(57) ABSTRACT

A frame shutter type device provides a separated well in which the storage node is located. The storage node is also shielded by a light shield to prevent photoelectric conversion.

15 Claims, 3 Drawing Sheets

FRAME SHUTTER PIXEL WITH AN ISOLATED STORAGE NODE

CROSS REFERENCE TO RELATED APPLICATIONS

The present application is a divisional application of U.S. Pat. application Ser. No. 09/792,634, filed on Feb. 23, 2001, now U.S. Pat. No. 6,624,456 the disclosure of which is herewith incorporated by reference in its entirety.

BACKGROUND

CMOS active pixel image sensors may be operated using a "rolling" shutter. Such a shutter operates by reading out each row of pixels, and then resetting that individual row, and then rolling to read and then reset the next row of pixels. Each pixel hence gets read and then reset at slightly different times. Hence, each pixel has a slightly different time of integration. Some applications, such as high-speed photography, may require more time consistency than is possible using this approach. Therefore, in these other applications, a frame shutter may be used. In the frame shutter mode, all pixels in the array have substantially identical integration start times and integration stop times.

A frame shutter technique, using a photogate pixel with two transfer gates., is shown in FIG. 1. A bridge diffusion isolates the photogate PG from the floating diffusion sense node (FD). Hence the charge in the photogate may be integrated and reset independently. The charge is stored in a storage node 110, which may also be independently reset. Bridge diffusion BD2 isolates the photogate from the storage node. A second bridge diffusion BD1 isolates the photogate collection area from a reset level Vaa. The charge level in the photogate collection area 100 may be transferred to a storage node 110 via transfer gate 105.

This isolation allows the integration regions of all the photogates in the entire array to be clocked globally. The same timing therefore exists for each of the plurality of pixels in the array. Moreover, the charge is preserved until the desired time of readout. This enables the active pixel sensor can be read out row by row, thereby allowing the same readout structure as is currently used.

SUMMARY

The present application teaches a new structure which isolates the storage node in order to provide a better image quality in the resultant structure.

BRIEF DESCRIPTION OF THE DRAWINGS

These and other aspects will now be described in detail with reference to the accompanying drawings, wherein.

DETAILED DESCRIPTION

Figure 1:
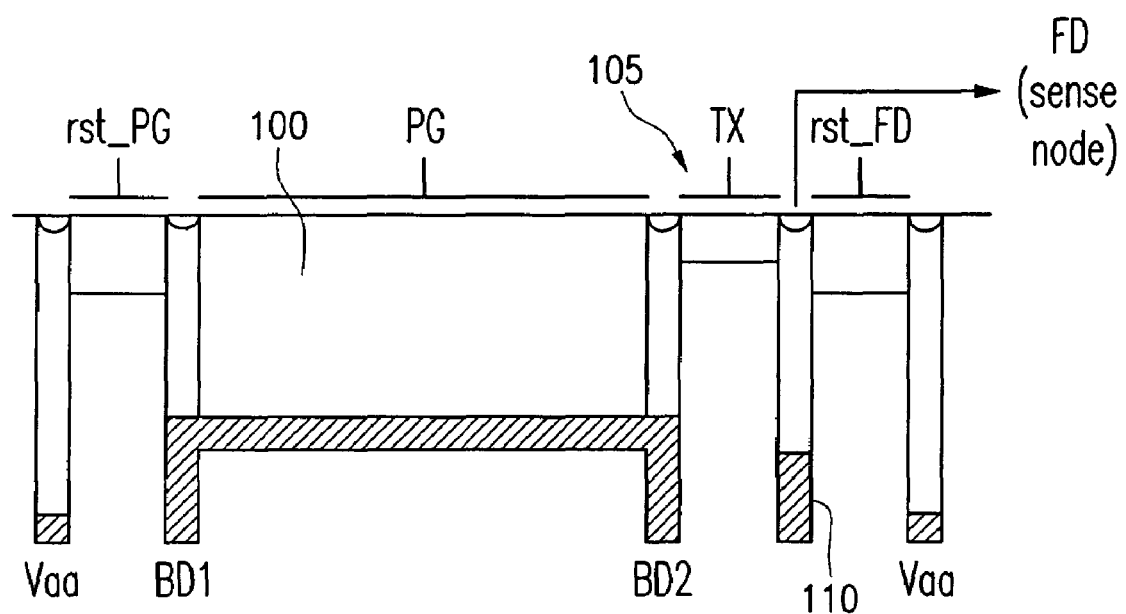
FIG. 1 shows a traditional photogate frame shutter.

The present inventors have recognized that a problem may occur with the conventional technique shown in FIG. 1. This problem may result from charge collection by the storage node 110. The storage node 110 may itself behave like a small photodiode. As such, the storage node 110 may collect some of the charge which is not collected by the photogate 100. This charge may be collected during the entire storage and/or readout time. This integration uses the rolling shutter type, providing a different readout period for each row of pixels. Hence, the entire storage time may typically be much longer than the desired frame shutter integration time. This leakage may correspond to image smear, and also may become more severe as the photogate size is reduced to make smaller pixel sizes.

According to the present system, embodiments of which are disclosed herein, the storage node is placed inside a protected area. For example, the storage node, which is the node that stores the photoelectrically induced signal, i.e. the charge from the photoreceptor after the charge integration time, may be placed inside an N type well that is protected by a light shield, e.g., a metal light shield. The shield has the effect of preventing a light induced signal from effecting the amount of charge stored in the storage node. The shield may prevent photons from converting into a photoelectric signal such as charge within the N well.

Any charge that is generated in the other regions of the pixel that diffuses to the N well boundary, will be swept into the well contact and hence will never reach the storage node. Of course, small leakage signals may still exist. The signals result primarily from photons which reach the N well as a result of multiple reflections. This is substantially reduced as compared with the kind of conventional system.

Figure 2A:
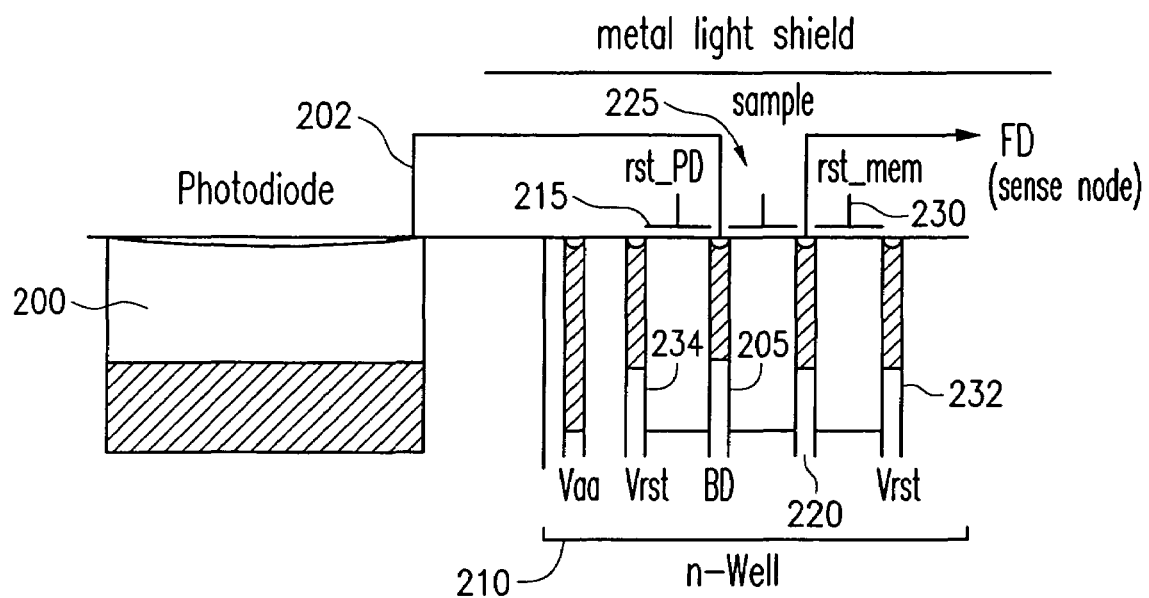
FIGS. 2A and 2B shows a first frame shutter with an isolated storage node with a photodiode.
Figure 2B:
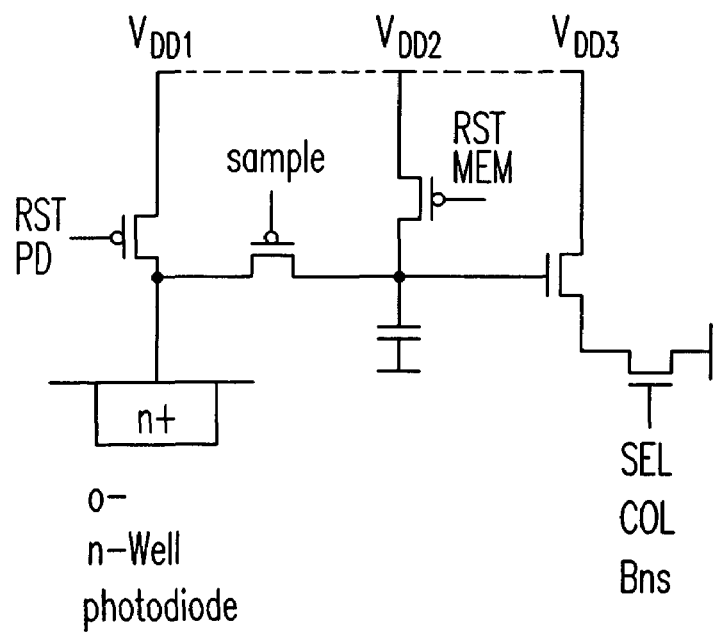

FIGS. 2A show a first embodiment. FIG. 2A shows a well view of the embodiment, while FIG. 2B shows a transistor level circuit for this embodiment. The pixel in FIG. 2A shown while integrating, with both the photoreceptor 200 and floating diffusion sense node FD having been reset. The storage well 220 is still at its reset level; that is the level Vrst, as in the reset well 232.

N-well 210 isolates the wells, including storage well 220, from the receptor, here photodiode 200, in the substrate. The isolated wells may include reset diffusions 232, 234. The diffusion 234 is a photodiode reset, actuated via NMOS transistor 225. The floating diffusion reset well 232 is actuated via PMOS transistor 230.

The photodiode 200 may be a standard n type photodiode. This is electrically connected via 202 to a P-type bridge diffusion node 205 within n type well 210. The bridge diffusion receives charge from the photodiode.

The photodiode may be reset by lowering the voltage on the gate 215. This forces both the photodiode and bridge diffusion node 205 to the voltage Vrst. When the reset is removed, the photodiode 200 begins to integrate the incoming photoelectric signal. This reduces the voltage on both the photodiode 200, and the connected bridge diffusion node 205.

At the end of the integration period, the signal on the photodiode and bridge diffusion well 205 is sampled onto the storage type P node 220, by lowering the voltage on the sampling gate 225. The charge is transferred from the photodiode to the storage node in proportion to its relative capacitance. Later, the sample gate 225 is released, and the storage node 220 becomes isolated from any photoelectric current in bridge diffusion 205 by the sample gate 225. The storage node 220 is also isolated from photoelectric current in the substrate by the N well.

The stored value in the storage node 220 is read out in the traditional method of CMOS active pixel sensor read out.

After readout, the storage node 220 is reset to the reset value Vrst in well 232, using the reset memory gate 230. The stored voltage will be:

$$V_{stored} = V_{rst} - \frac{Q_{photons}}{C_{storage} + C_{bridge} + C_{pd}}$$

The conversion gain is based on the ratio of the storage capacitance to the total capacitance of the storage well 220 + bridge diffusion 205 + photodiode 200.

In practice, it is important to keep the charge injection substantially identical for each pixel. The charge injection can result from the raising of the voltage on the sample gate and to reset gates. Accurate control of the rise and fall times of the control signals can make sure that this charge injection stays constant.

Figure 3:
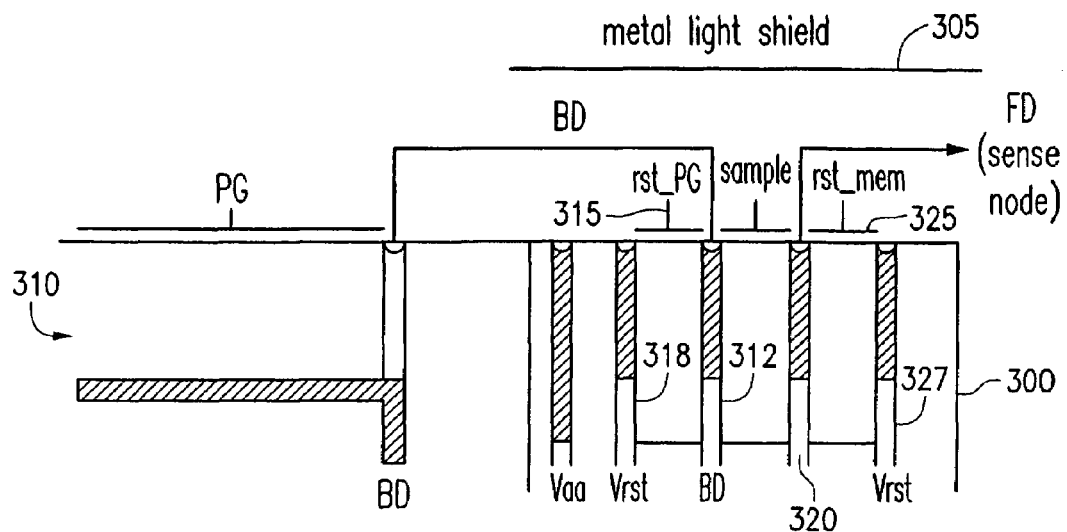
FIG. 3 shows a second frame shutter with an isolated storage node using a photogate.

An alternative embodiment is shown in FIG. 3. FIG. 3 shows a view of the wells of a single pixel during the integration time. In the FIG. 3 embodiment, a photogate is used as the photoreceptor.

Both the photogate (PG) and the storage node 320 for the floating diffusion sense node (FD) have been reset. The storage node 320 is shown at the reset level in FIG. 3.

N well 300 is located under a light shield 305, and the storage node 320 is isolated from the substrate by the N well, as in the embodiment of FIG. 2. In this embodiment, the photogate 310 is connected to bridge diffusion 312. The value of the photogate may be reset by activating PMOS gate 315, to connect the bridge diffusion and photogate to the photogate reset well 318, which is held at the reset level Vrst. Analogously, the storage node is reset by activating PMOS reset memory gate 325, bringing the storage node 320 to the reset level in storage node reset well 327.

This embodiment may use a photogate photoreceptor. The photogate allows charge to be collected over the same region as the photodiode pixel as described with reference to FIG. 2. However, conversion gain may be increased in some situations by lowering the voltage on the photogate in order to force any charge that is present into the bridge diffusions during both the reset of the collection region and during sampling. This may compensate for the capacitance of the photoreceptor, which capacitance can actually be quite significant. Accordingly, the stored voltage can be considered as:

$$V_{stored} = V_{rst} - \frac{Q_{photons}}{C_{storage} + C_{bridge}}$$

This system may therefore increase conversion gain. However, the photogate may have a lower quantum efficiency than the photodiode. Therefore, any advantages of the second embodiment may be offset by quantum efficiency disadvantages.

Figure 4:
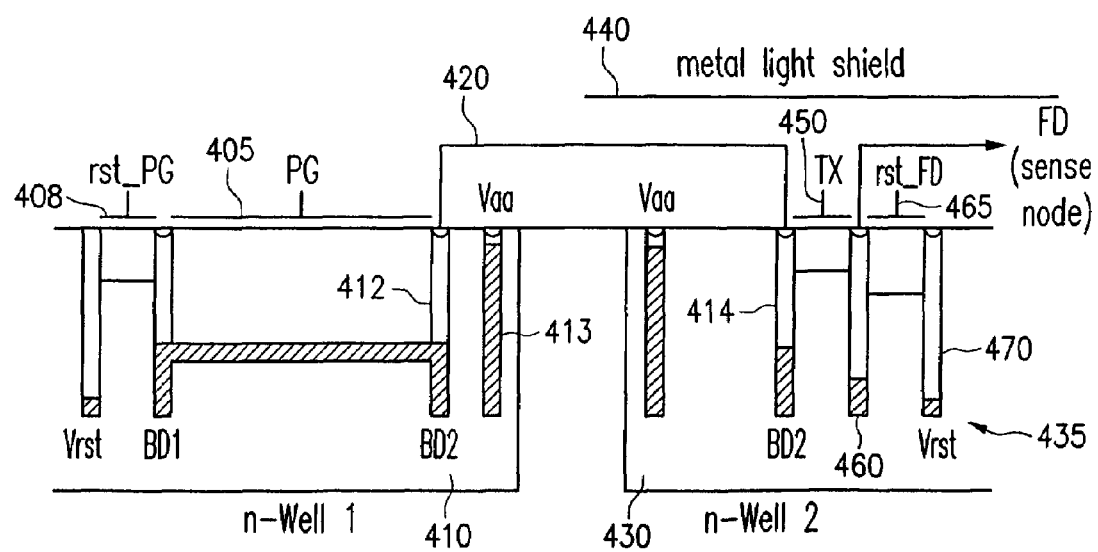
FIG. 4 shows an dual well embodiment.

Another embodiment shown in FIG. 4 forms separated wells, a first well 410 for the photoreceptor 405 and a second well 430 for the readout circuit 435. This device is shown in charge integration mode, having lower positions corresponding to lower voltages. Holes may be integrated under the photogate 405 to form charge which is stored in one of the bridge diffusions 412 within the photo gate. The photogate is located in the first well 410. In this embodiment, the photogate may be reset within the first N well 410. The photogate is reset by activating the gate 408 to bring the photogate level to the reset level Vrst. This has the effect of clearing the charge within the photogate 405 as well as the bridge diffusions 412 and 414. An anti blooming gate 413 may also be located within the first well 410.

The output of the photogate is connected by a wire 420 to the bridge diffusion 414 within the second N well 430. The charge may be transferred. The value in the bridge diffusions may also be transferred by the transfer gate 450 to the floating diffusion sensing node. The storage node 460 may be reset independently to the value in reset well 470 by activating the storage node reset gate 465.

In this embodiment, the gates are formed of P type MOS structures.

This pixel is operated in the same manner as the original photogate frame shutter, but with the signals converted to take into account the P type transistors. The conversion gain is:

$$V_{stored} = V_{rst} - \frac{Q_{photons}}{C_{storage}}$$

as in the above second embodiment, use of a photogate may reduce the quantum efficiency, and hence may offset some of the otherwise-obtained improvements.

Although only a few embodiments have been disclosed in detail above, other modifications are possible. For example, the photoreceptors as disclosed above could be other photoreceptor's besides the ones that are specifically disclosed. In addition, the sense of the semiconductor substrates, that is N type gates and P type gates could be reversed. The N type well could of course be replaced by a P type well.

All such modifications are intended to be encompassed within the following claims, in which:

What is claimed is:

1. A method comprising:
receiving a photoelectrically induced signal in an array of photoreceptors on a semiconductor substrate;
controlling each photoreceptor in the array of photoreceptors to simultaneously initiate a common integration period;
at the end of each integration period, controlling each photoreceptor in the array of photoreceptors to transfer its photoelectrically induced signal to a respective storage node located within a respective semiconductor well region formed in the semiconductor substrate; and
preventing each storage node from integrating charge,
wherein each storage node is doped to a first conductivity type, and
wherein a portion of each semiconductor well surrounding each storage node is doped to a second conductivity type.

2. The method of claim 1, wherein said preventing comprises shielding each storage node with a light shield overlying at least said respective storage node.

3. The method of claim 1, wherein said preventing comprises shielding each semiconductor well with a light shield overlying said respective semiconductor well.

4. The method of claim 3, further comprising enabling a first reset operation which resets a value of each storage node, and enabling a second reset operation, which resets a value of each photoreceptor.

5. The method of claim 4, wherein said first and second reset operations each comprises activating a gate within each semiconductor well.

6. The method of claim 5, wherein each photoelectrically induced signal is a signal indicative of charge produced by a respective photoreceptor during said integration period.

7. The method of claim 5, wherein each photoreceptor includes a photodiode.

8. The method of claim 5, wherein each photoreceptor includes a photogate.

9. The method of claim 3, further comprising preventing each photoreceptor from acquiring a photoelectrically induced signal which is greater than a pre-determined amount.

10. The method of claim 3, wherein each of the plurality of photoreceptors in the array comprises a second semiconductor well.

11. The method of claim 10, further comprising removing charge from each photoreceptor with an anti blooming gate located within each second semiconductor well.

12. The method of claim 10, further comprising resetting each photoreceptor with reset gates located within each second semiconductor wells.

13. The method of claim 1, further comprising resetting each storage node with a reset transistor provided within each semiconductor well.

14. The method of claim 1, further comprising transferring charge from each photoreceptor to each storage node with a transfer gate provided within each semiconductor well region.

15. The method of claim 1, further comprising isolating each storage node with a bridge diffusion node located within each semiconductor well region.

* * * * *